(12) United States Patent
Ju

(10) Patent No.: US 6,914,192 B2
(45) Date of Patent: Jul. 5, 2005

(54) ADAPTER-CONNECTOR AND CONDUCTOR SET

(76) Inventor: Ted Ju, No. 15, Wu Shiunn St., An Leh District, Keelung City (TW)

( * ) Notice: Subject to any disclaimer, the term of this patent is extended or adjusted under 35 U.S.C. 154(b) by 0 days.

(21) Appl. No.: 10/646,777

(22) Filed: Aug. 25, 2003

(65) Prior Publication Data

US 2005/0045363 A1 Mar. 3, 2005

(51) Int. Cl.[7] ................................................ H02G 3/06
(52) U.S. Cl. ........................ 174/94 R; 439/66; 439/342
(58) Field of Search ......................... 174/94 R; 439/66, 439/295, 342, 862

(56) References Cited

U.S. PATENT DOCUMENTS 6,379,176 B1 * 4/2002 Ohsawa et al. ............. 439/495
6,485,338 B1 * 11/2002 Wu ............................. 439/862
2004/0142606 A1 * 7/2004 Fogg ........................... 439/862

* cited by examiner

Primary Examiner—Chau N. Nguyen
(74) Attorney, Agent, or Firm—Varndell & Varndell, PLLC

(57) ABSTRACT

A set of conductor and an adapter-connector to allow easier process, reliable securing and guaranteed effective contact with its adapted electronic device is characterized by that the conductor containing a main portion, a resilient arm and a conduction part; both of the resilient arm and the conduction part being extended in parallel from one end of the main portion; the resilient arm being further bent in opposite direction to extend for a certain length, then further bent for a certain angle; a contact being provided on the resilient arm at a level higher than that of the top of the main portion.

14 Claims, 5 Drawing Sheets

ADAPTER-CONNECTOR AND CONDUCTOR SET

BACKGROUND OF THE INVENTION (a) Field of the Invention

The present invention is related to a set of an adapter-connector and conductor, and more particularly, to a connector adapted with a compression contact conductor.

(b) Description of the Prior Art

Connection between a connector and its adapted electronic device comes diversified. Within a compression contact type of connector is used to adapt to an electronic device, and the connection between the connector and the adapted electronic device is realized by means of a conductor. As illustrated in FIGS. 1 and 2 of the accompanying drawings, the conductor is comprised of a fixed part 1, a contact arm 2 extending upward from the fixed part 1, a connection arm 3 for material band bent and extending sideway from the contact arm 2, and a soldering end 4 extending downward from the fixed part 1 then bent backward for 90 degrees to connect a solder 41, e.g., a tin ball. Upon installation, the conductor is fixed to an insulator 5 with the fixed part 1 retained in a sink 51 of the insulator 5, and the conductor is then soldered to a circuit board (not illustrated). In use, an adapted electronic device (not illustrated) is pressed onto the conductor for a contact 6 provided at the terminal of the contact arm 2 to contact the adapted electronic device for achieving the electric connection. However, at least three flaws are observed with the conductor. Firstly, with the adapter-connector being provided with a given height and the smaller length of the fixed part of the conductor, the conductor may fail to be secured to the insulator. Secondly, the contact arm is shorter and yields smaller resilience, the contact arm is vulnerable to be deformed after several times of compression, leading to the failure of effective contact for the adapter-connector with the adapted electronic device, and the performance of the adapter-connector is compromised. Thirdly, the process for the conductor is comparatively complicate, since it requires multiple folding.

SUMMARY OF THE INVENTION

The primary purpose of the present invention is to provide a set of an adapter-connector and conductor that allows easier process, reliable securing and guaranteed effective contact with its adapted electronic device.

Another purpose of the present invention is to provide a set of an adapter-connector and conductor that offers higher reliability and lower contact resistance to ensure of good performance of the adapter-connector.

To achieve these purposes, the set of the adapter-connector and the conductor is comprised of a main portion, a resilient arm and a conduction part with the resilience arm and the conduction part extending in parallel from the main portion, and the resilient arm then bent in the opposite direction to extend for a certain length before being bent again for a certain angle, and a contact being provided at the terminal of the resilient arm at a point higher than the top of the main portion to allow easier process. reliable securing and guaranteed effective contact with the adapted electronic device.

DETAILED DESCRIPTION OF THE PREFERRED EMBODIMENTS

Figure 1:
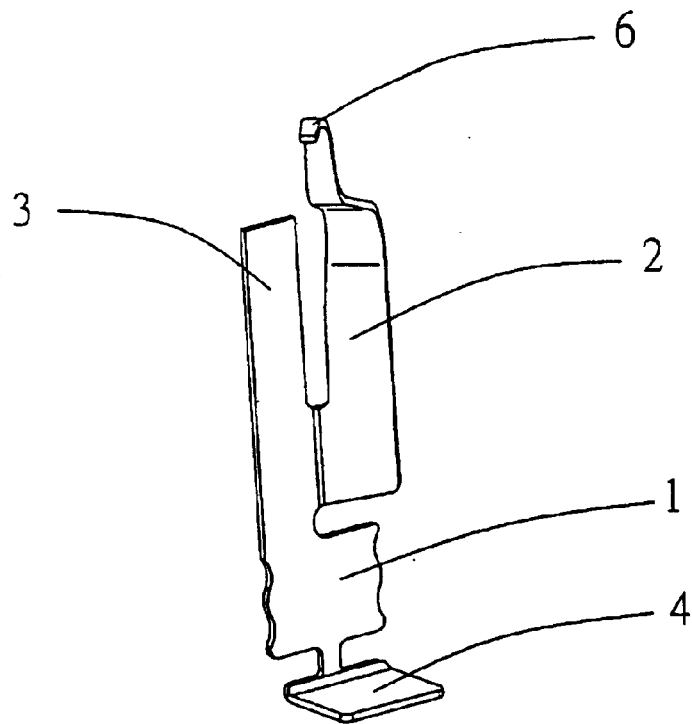
FIG. 1 is a perspective view of a conductor of the prior art.
Figure 2:
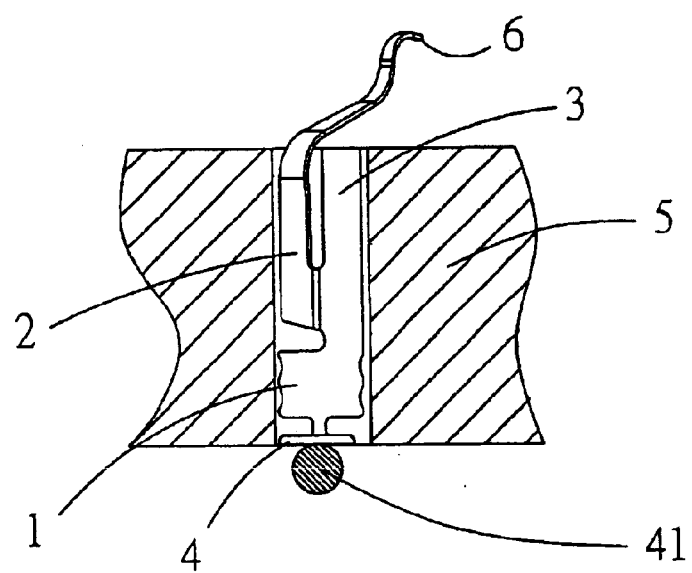
FIG. 2 is a sectional view showing a local part of the adapter-connector of the prior art.
Figure 3:
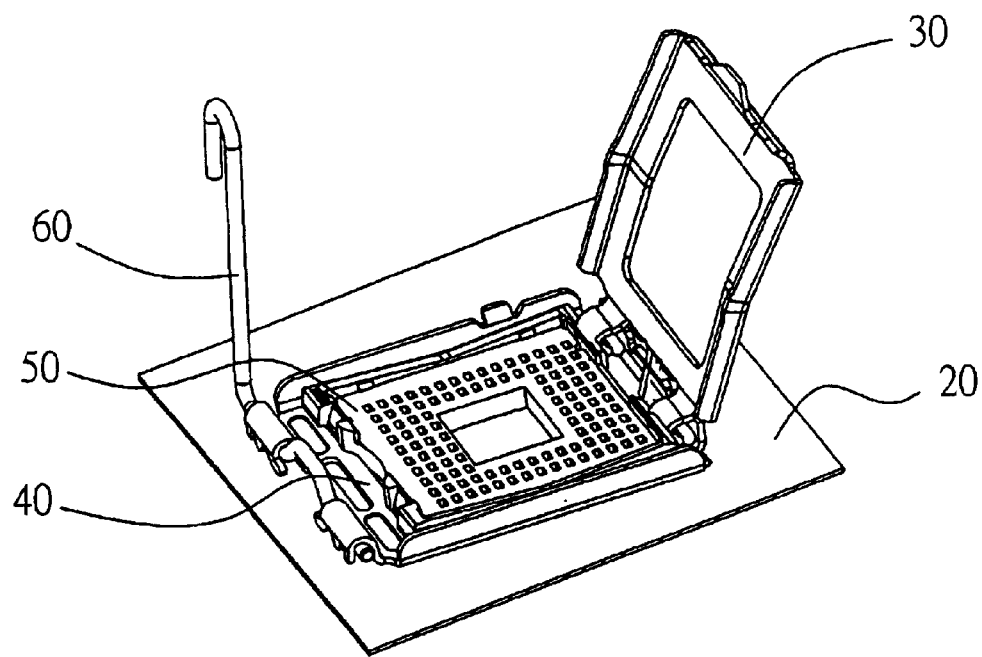
FIG. 3 is a perspective view of an adapter-connector of a first preferred embodiment of the present invention and a circuit board.
Figure 4:
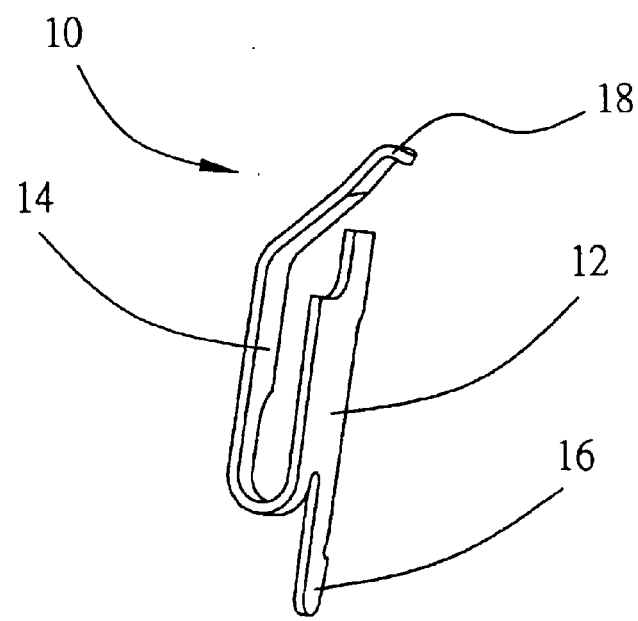
FIG. 4 is a perspective view of a conductor of the first preferred embodiment of the present invention.
Figure 5:
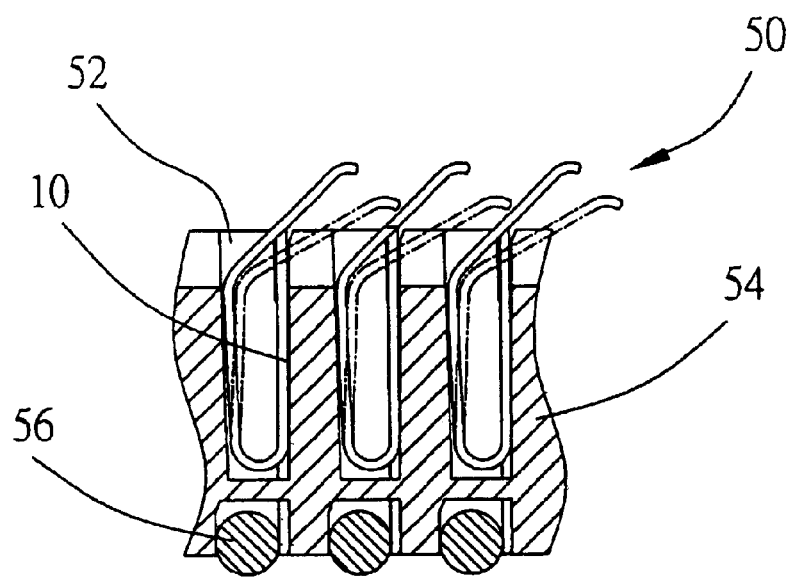
FIG. 5 is a sectional view of the conductor of the first preferred embodiment of the present invention installed in an insulator.

As illustrated in FIGS. 3, 4, and 5, a conductor 10 of the present invention is comprised of a main portion 12, a resilient arm 14 and a connection part 16 extend below the main portion 12 with the resilient arm 14 being further bent in opposition direction for 180 degrees backward to supercede the top of the main portion 12 and then folder towards the main portion 12 for a certain angle. A contact 18 is provided at the terminal of the resilient arm 14 at a level higher than the top of the main portion 12 to adapt to an electronic device (not illustrated). A mobile upper lid 30 and a mobile lower lid 40, a fixture 50 located between the upper and the lower lids 30, 40 and a dancer 60 used to buckle up the upper and the lower lids 30, 40 are connected to the adapter-connector of the present invention. Wherein, the fixture 50 contains multiple insulators 54 including multiple sinks 52, and multiple tin balls 56 (or any other devices that can be easily melted) are provided below each of those sinks 52. Each conductor 10 is installed in the sink 52 to contact respective tin ball 56. Upon assembling, the conductor 10 passes through the main portion 12 and fixed in the sink 52 of the insulator 54 with the contact 18 protruding over the insulator 54 to be connected to the adapted electronic device and the conduction part 16 passes through the tin ball 56 to be soldered to a circuit board (not illustrated). When the conductor 10 is connected to the adapted electronic device, the adapted electronic device contacts the contact 18 to compress the resilient arm 14 as illustrated by the dotted line in FIG. 4 to guarantee effective contact between the conductor 10 and its adapted electronic device.

Whereas the resilient arm 14 of the conductor 10 extends below the main portion 12, it is provided at the same height of the insulator 54 for the conductor 10 to be secured in the insulator 54. Furthermore, the resilient arm 14 is longer and gives better resilience, it is free of plastic deformation after multiple times of compression to guarantee effective contact between the conductor 10 and its adapted electronic device. The simple structure of the conductor 10 also makes the process much easier.

Figure 6:
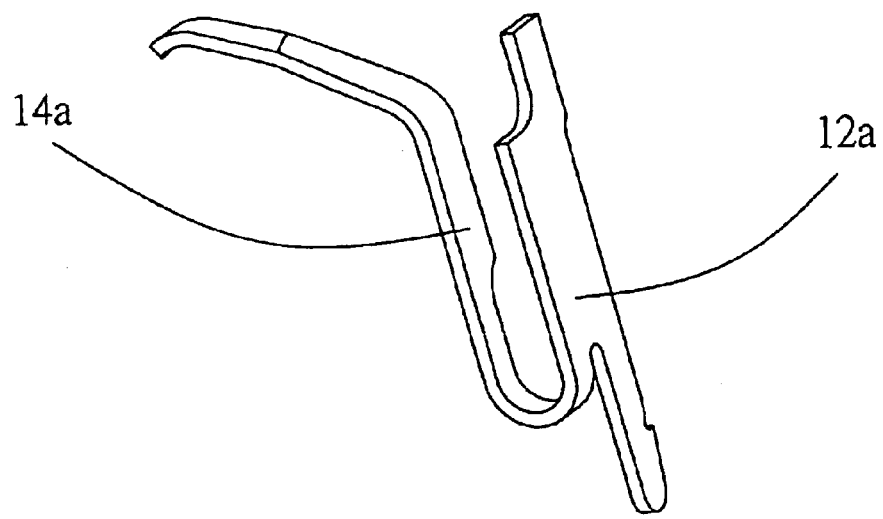
FIG. 6 is a perspective view of a conductor of a second preferred embodiment of the present invention.
Figure 7:
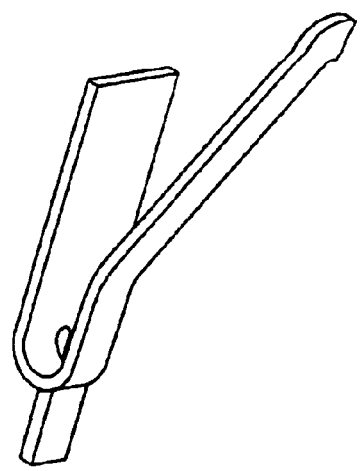
FIG. 7 is a perspective view of a conductor of a third preferred embodiment of the present invention.
Figure 8:
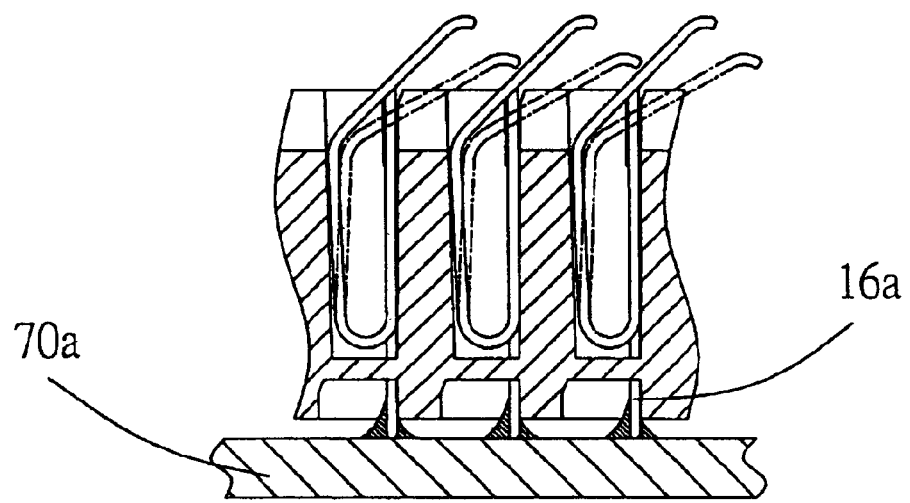
FIG. 8 is a sectional view of a conductor of a fourth preferred embodiment of the present invention installed in an insulator.
Figure 9:
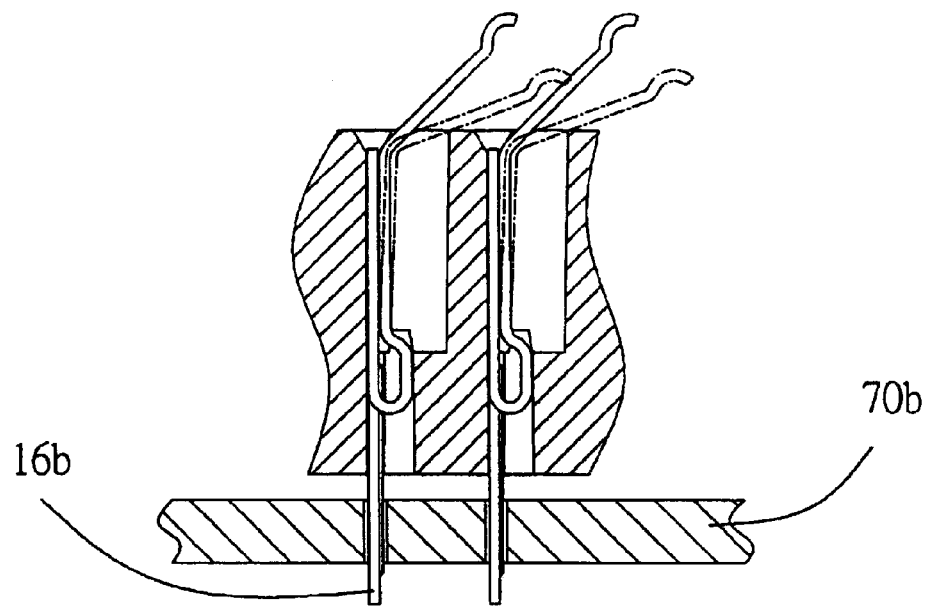
FIG. 9 is a sectional view of a conductor of a fifth preferred embodiment of the present invention installed in an insulator.

The conductor 10 can be made in other forms such as illustrated in FIG. 6 with a resilient arm 14a bent in opposite direction for 180 degrees then bent away from a main portion 12a for a certain angle, or as illustrated in FIG. 7, with the resilient arm 14a bent sideway for a certain angle to achieve the same effects of easier process, reliable securing and guaranteed effective contact between the conductor and its adapted electronic device. A conduction part 16a may directly contact the circuit board by compression, or be forthwith soldered to a circuit board 70a as illustrated in FIG. 8, or a conduction part 16b may further extend downward to pass through and soldered to a circuit board 70b as illustrated in FIG. 9.

Figure 10:
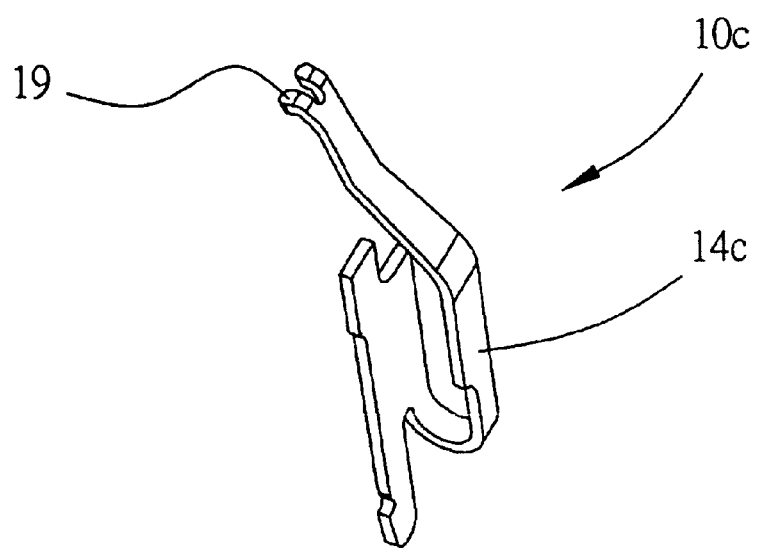
FIG. 10 is a perspective view of a conductor of a sixth preferred embodiment of the present invention.

Now referring to FIG. 10, two contact arms 19 may be provided at the terminal of a resilient arm 14c of a conductor 10c to respectively contact an adapted electronic device (not illustrated). Whereas the terminal provided with those two contact arms 19 achieves two-point contact with the adapted electronic device, it gives higher reliability and lower contact resistance than the one-point contact as provided by the prior art to ensure of the good performance of the adapter-connector.

What is claimed is:

1. A conductor comprised of a main portion, a resilient arm and a conduction part, both of the resilient arm and the conduction part extending from one end of the main portion, the conduction part extending coplanar with the main portion; the resilient arm including a first portion having an arc shape, a second portion extending substantially parallel with the main portion, and a third portion bent for a certain angle to extend a certain length; and a contact being provided on the resilient arm at a level higher than that of the top of the main portion.

2. A conductor as claimed in claim 1, wherein the third portion of the resilient arm is bent at an angle either facing or turning away from the main portion.

3. A conductor as claimed in claim 2, wherein, a solder is connected to the conduction part to be soldered to a circuit board.

4. A conductor as claimed in claim 1, wherein, the resilient arm is bent in opposite direction to extend for a certain length and further bent for a certain angle sideway from the main portion.

5. A conductor as claimed in claim 4, wherein, a solder is connected to the conduction part to be soldered to a circuit board.

6. A conductor as claimed in claim 1, wherein, a solder is connected to the conduction part to be soldered to a circuit board.

7. An adapter-connector soldered to a circuit board comprised of multiple insulators containing multiple conductors with each conductor containing a main portion, a resilient arm and a conduction part, both of the resilient arm and the conduction part extending from one end of the main portion, the conduction part extending coplanar with the main portion; the resilient arm including a first portion having an arc shape, a second portion extending substantially parallel with the main portion, and a third portion bent for a certain angle to extend a certain length; and a contact being provided on the resilient arm at a level higher than that of the top of the main portion.

8. An adapter-connector as claimed in claim 7, wherein, the adapter-connector includes a mobile upper lid and a mobile lower lid covering up those insulators, and a dancer to buckle up both of the upper and the lower lids.

9. An adapter-connector as claimed in claim 8, wherein, a solder is connected to the conduction part to be soldered to a circuit board.

10. An adaptor-connector as claimed in claim 7, wherein the third portion of the resilient arm is bent in an opposite direction relative to the arc shape of the second portion to extend for a certain length and further bent for a certain angle either facing or turning away from the main portion.

11. An adapter-connector as claimed in claim 10, wherein, a solder is connected to the conduction part to be soldered to a circuit board.

12. An adapter-connector as claimed in claim 7, wherein, the resilient arm is bent in opposite direction to extend for a certain length and further bent for a certain angle sideway from the main portion.

13. An adapter-connector as claimed in claim 12, wherein, a solder is connected to the conduction part to be soldered to a circuit board.

14. An adapter-connector as claimed in claim 7, wherein, a solder is connected to the conduction part to be soldered to a circuit board.

* * * * *